United States Patent
Zhang

(10) Patent No.: US 8,760,991 B2
(45) Date of Patent: Jun. 24, 2014

(54) SYSTEMS AND METHODS FOR POST PROCESSING GAIN CORRECTION

(75) Inventor: Haotian Zhang, Longmont, CO (US)

(73) Assignee: LSI Corporation, San Jose, CA (US)

( * ) Notice: Subject to any disclaimer, the term of this patent is extended or adjusted under 35 U.S.C. 154(b) by 53 days.

(21) Appl. No.: 13/539,709

(22) Filed: Jul. 2, 2012

(65) Prior Publication Data

US 2013/0124949 A1    May 16, 2013

Related U.S. Application Data

(60) Provisional application No. 61/559,218, filed on Nov. 14, 2011.

(51) Int. Cl.
*G11B 7/00* (2006.01)

(52) U.S. Cl.
USPC ..................................................... 369/124.1

(58) Field of Classification Search
USPC ........ 369/124.1, 124.11, 59.15, 47.28, 44.29; 714/795, 794, 796; 360/32, 39
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |

(Continued)

OTHER PUBLICATIONS

U.S. Appl. No. 13/426,714, filed Mar. 22, 2012, Yang.

(Continued)

*Primary Examiner* — Nabil Hindi
(74) *Attorney, Agent, or Firm* — Hamilton DeSanctis & Cha

(57) ABSTRACT

Various embodiments of the present invention provide circuits, systems and methods for data processing. For example, a data processing system is disclosed that includes: a data detector circuit, a filter circuit, a gain error generation circuit, and a multiplier circuit. The data detector circuit is operable to apply a data detection algorithm to a data set to yield a detected output. The filter circuit is operable to filter the detected output to yield a filtered output. The gain error generation circuit is operable to calculate an error value based upon a combination of an instance of the data set and a corresponding instance of the filtered output. The multiplier circuit operable to multiply the instance of the data set by a gain feedback value to yield a gain corrected output. The gain feedback value is derived from the error value.

21 Claims, 6 Drawing Sheets

(56) References Cited

U.S. PATENT DOCUMENTS

| | | | |
|---|---|---|---|
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,986,098 B2 | 1/2006 | Poeppelman | |
| 7,047,474 B2 | 5/2006 | Rhee | |
| 7,058,873 B2 | 6/2006 | Song | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,184,486 B1 | 2/2007 | Wu | |
| 7,191,378 B2 | 3/2007 | Eroz | |
| 7,203,887 B2 | 4/2007 | Eroz | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Casado | |
| 7,952,824 B2 | 5/2011 | Dziak | |
| 7,957,251 B2 * | 6/2011 | Ratnakar Aravind et al. | 369/124.11 |
| 7,958,425 B2 | 6/2011 | Chugg | |
| 7,996,746 B2 | 8/2011 | Livshitz | |
| 8,018,360 B2 | 9/2011 | Nayak | |
| 8,201,051 B2 | 6/2012 | Tan | |
| 8,237,597 B2 | 8/2012 | Liu | |
| 8,261,171 B2 | 9/2012 | Annampedu | |
| 8,291,284 B2 | 10/2012 | Savin | |
| 8,295,001 B2 | 10/2012 | Liu | |
| 8,413,032 B1 * | 4/2013 | Song et al. | 714/795 |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0185643 A1 | 7/2009 | Fitzpatrick | |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0262814 A1 | 10/2012 | Li | |
| 2012/0265488 A1 | 10/2012 | Sun | |

OTHER PUBLICATIONS

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^\wedge$ m) LDPC Decoders", IEEE Transactions on Circuits and Systems—I: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Xiao, et al "Nested Codes With Multiple Interpretations" retrieved from the Internet URL: http://www.ece.nmsu.edu/~jkliewer/paper/XFKC_CISSO6 (retrieved on Dec. 5, 2012).

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. On Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

(56) References Cited

OTHER PUBLICATIONS

Zhong et al., "Quasi Cyclic LDPC Codes for the Magnetic Recording Channel: Code Design and VSLI Implementation", IEEE Transactions on Magnetics, v. 43, pp. 1118-1123, Mar. 07.

Zhong, "Block-LDPC: A Practical LDPC Coding System Design Approach", IEEE Trans. On Circuits, Regular Papers, vol. 5, No. 4, pp. 766-775.

U.S. Appl. No. 13/186,234, Unpublished (filing date Jul. 19, 2011) (Haitao Xia).
U.S. Appl. No. 13/327,279, Unpublished (filing date Dec. 15, 2011) (Wei Feng).
U.S. Appl. No. 13/340,974, Unpublished (filing date Dec. 30, 2011) (Dan Liu).
U.S. Appl. No. 13/445,848, Unpublished (filing date Apr. 12, 2012) (Bruce Wilson).
U.S. Appl. No. 13/340,951, Unpublished (filing date Dec. 30, 2011) (Lei Chen).
U.S. Appl. No. 13/369,468, Unpublished (filing date Feb. 9, 2012) (Zongwang Li).
U.S. Appl. No. 13/269,852, Unpublished (filing date Oct. 10, 2011) (Haitao Xia).
U.S. Appl. No. 13/284,730, Unpublished (filing date Oct. 28, 2011) (Fan Zhang).
U.S. Appl. No. 13/295,150, Unpublished (filing date Nov. 14, 2011) (Zongwang Li).
U.S. Appl. No. 13/284,767, Unpublished (filing date Oct. 28, 2011) (Fan Zhang).
U.S. Appl. No. 13/269,832, Unpublished (filing date Oct. 10, 2011) (Haitao Xia).
U.S. Appl. No. 13/445,878, Unpublished (filing date Apr. 12, 2012) (Yu Liao).
U.S. Appl. No. 13/239,683, Unpublished (filing date Sep. 22, 2011) (Changyou Xu).
U.S. Appl. No. 13/283,549, Unpublished (filing date Oct. 27, 2011) (Wu Chang).
U.S. Appl. No. 13/213,751, Unpublished (filing date Aug. 19, 2011) (Fan Zhang).
U.S. Appl. No. 13/174,537, Unpublished (filing date Jun. 30, 2011) (Anantha Raman Krishnan).
U.S. Appl. No. 13/296,022, Unpublished (filing date Nov. 14, 2011) (Victor Krachkovsky).
U.S. Appl. No. 13/305,551, Unpublished (filing date Nov. 28, 2011) (Yang Han).
U.S. Appl. No. 13/227,416, Unpublished (filing date Sep. 7, 2011) (Lei Chen).
U.S. Appl. No. 13/305,510, Unpublished (filing date Nov. 28, 2011) (Lei Chen).
U.S. Appl. No. 13/302,119, Unpublished (filing date Nov. 22, 2011) (Lei Chen).
U.S. Appl. No. 13/300,078, Unpublished (filing date Nov. 18, 2011) (Chung-Li Wang).
U.S. Appl. No. 13/174,453, Unpublished (filing date Jun. 30, 2011) (Johnson Yen).
U.S. Appl. No. 13/180,495, Unpublished (filing date Jul. 11, 2011) (Chung-Li Wang).
U.S. Appl. No. 13/415,326, Unpublished (filing date Mar. 8, 2012) (Shaohua Yang).
U.S. Appl. No. 13/227,544, Unpublished (filing date Sep. 8, 2011) (Shaohua Yang).
U.S. Appl. No. 13/483,100, Unpublished (filing date May 30, 2012) (Fan Zhang).
U.S. Appl. No. 13/483,105, Unpublished (filing date May 30, 2012) (Xuebin Wu).
U.S. Appl. No. 13/316,741, Unpublished (filing date Dec. 12, 2011) (Yang Han).
U.S. Appl. No. 13/113,219, Unpublished (filing date May 23, 2011) (Yang Han).
U.S. Appl. No. 13/415,430, Unpublished (filing date Mar. 8, 2012) (Nayak Ratnakar Aravind).
U.S. Appl. No. 13/171,615, Unpublished (filing date Jun. 29, 2011) (Bradley D. Seaga).
U.S. Appl. No. 13/433,693, Unpublished (filing date Mar. 29, 2012) (Fan Zhang).
U.S. Appl. No. 13/422,986, Unpublished (filing date Mar. 16, 2012) (Fan Zhang).
U.S. Appl. No. 13/372,580, Unpublished (filing date Feb. 14, 2012) (Fan Zhang).
U.S. Appl. No. 13/426,714, Unpublished (filing date Mar. 22, 2012) (Shaohua Yang).
U.S. Appl. No. 13/412,520, Unpublished (filing date Mar. 5, 2012) (Fan Zhang).
U.S. Appl. No. 13/362,409, Unpublished (filing date Jan. 31, 2012) (Fan Zhang).
U.S. Appl. No. 13/316,858, Unpublished (filing date Dec. 12, 2011) (Zongwang Li).
U.S. Appl. No. 13/426,693, Unpublished (filing date Mar. 22, 2012) (Shaohua Yang).
U.S. Appl. No. 13/474,660, Unpublished (filing date May 17, 2012) (Zongwang Li).

\* cited by examiner

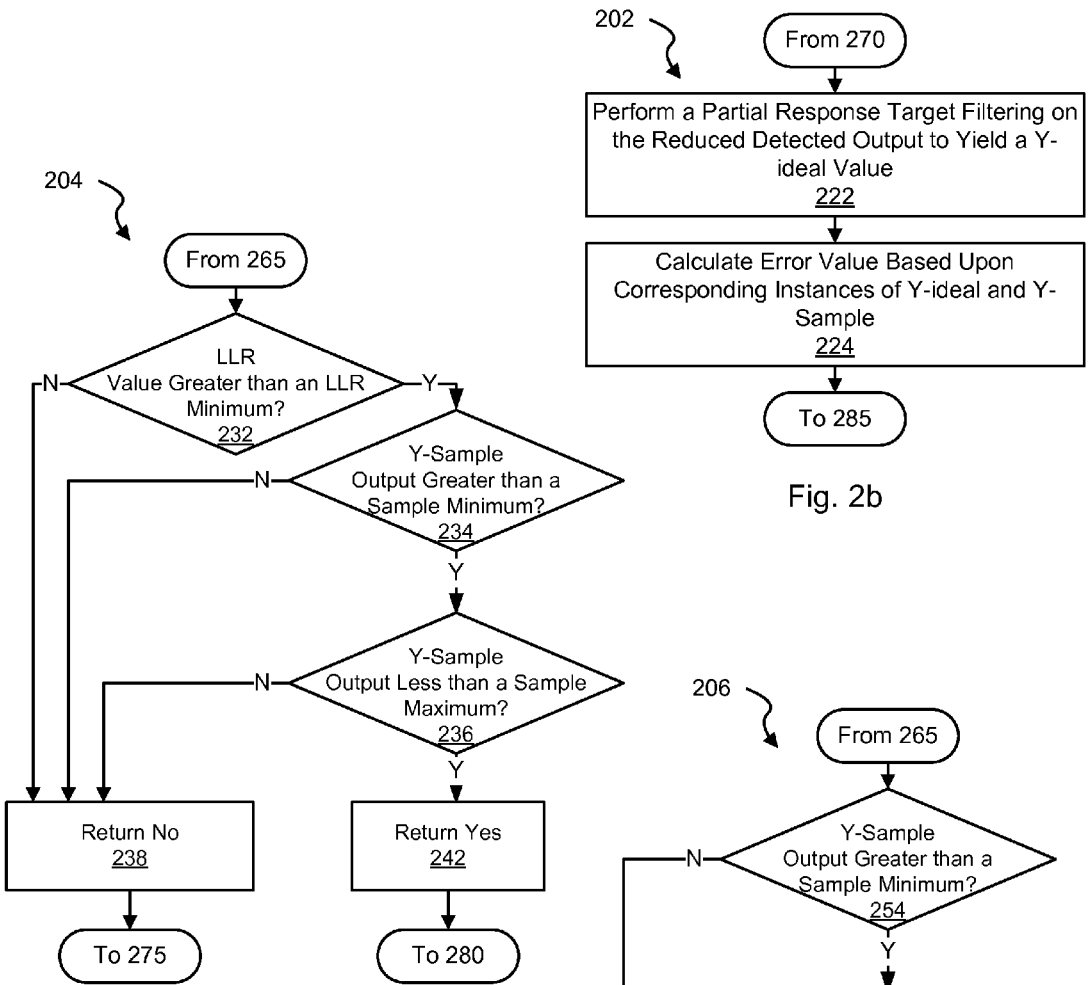
Fig. 2b
Fig. 2c
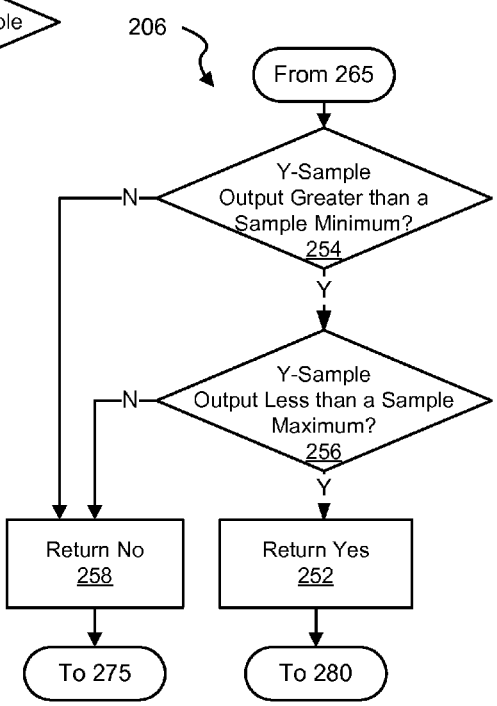
Fig. 2d

# SYSTEMS AND METHODS FOR POST PROCESSING GAIN CORRECTION

CROSS REFERENCE TO RELATED APPLICATIONS

The present application claims priority to (is a non-provisional application of) U.S. Prov. App. No. 61/559,218 entitled "Systems and methods for Post Processing Gain Correction", and filed Nov. 14, 2011 by Zhang. The entirety of the aforementioned reference is incorporated herein by reference for all purposes.

BACKGROUND OF THE INVENTION

The present invention is related to systems and methods for data processing, and more particularly to systems and methods for post processing error correction.

In various data processing systems low frequency gain distortion due to fly height variation and other causes. As an example, perpendicular recording systems may exhibit such frequency gain distortion. Typically, such systems utilize an analog gain control loop to adjust the gain and therefore correct the low frequency gain distortion. However, such an analog gain control loop may not effectively mitigate the low frequency gain distortion.

Hence, for at least the aforementioned reasons, there exists a need in the art for advanced systems and methods for data processing.

BRIEF SUMMARY OF THE INVENTION

The present invention is related to systems and methods for data processing, and more particularly to systems and methods for post processing error correction.

Various embodiments of the present invention provide data processing systems that include: a data detector circuit, a filter circuit, a gain error generation circuit, and a multiplier circuit. The data detector circuit is operable to apply a data detection algorithm to a data set to yield a detected output. The filter circuit is operable to filter the detected output to yield a filtered output. The gain error generation circuit is operable to calculate an error value based upon a combination of an instance of the data set and a corresponding instance of the filtered output. The multiplier circuit operable to multiply the instance of the data set by a gain feedback value to yield a gain corrected output. In such cases, the gain feedback value is derived from the error value. In some instances of the aforementioned embodiments, the data processing systems are implemented as part of an integrated circuit. In various cases, the data processing systems are implemented as part of a storage device. In other cases, the data processing systems are implemented as part of a data transmission device such as, but not limited to, a cellular telephone.

In some instances of the aforementioned embodiments, the data processing system further comprises an error accumulator circuit operable to average the error value with previously calculated error values to yield an average output. The gain feedback value is the average output. In one or more instances of the aforementioned embodiments, the gain error circuit is further operable to filter the instance of the data set to yield a reliability indication. In some such instances, filtering the instance of the data set to yield the reliability indication includes comparing the instance of the data set with a first threshold and as second threshold. The reliability indication identifies the instance of the data set as reliable when the instance of the data set is greater than the first threshold and less than the second threshold. In other such instances, filtering the instance of the data set to yield the reliability indication includes: comparing the instance of the data set with a first threshold and as second threshold; and comparing a soft data output from the data detector circuit corresponding to the instance of the data set against a third threshold value. The reliability indication identifies the instance of the data set as reliable when the instance of the data set is greater than the first threshold and less than the second threshold, and the soft data output is greater than the third threshold. In various such instances, the error value is set equal to one when the reliability indication identifies the instance of the data set as unreliable.

In some instances of the aforementioned embodiments, the data detector circuit is a first data detector circuit, the data detection algorithm is a first data detection algorithm, the detected output is a first detected output, and the data processing system further includes a second data detector circuit operable to apply a second data detection algorithm to the gain corrected output to yield a second detected output. In other instances of the aforementioned embodiments, the data detector circuit is a first data detector circuit, the data detection algorithm is a first data detection algorithm, the detected output is a first detected output, and the data processing system further includes a multiplexer circuit and a second data detector circuit. The multiplexer circuit is operable to provide one of the gain corrected output and the data set as a detector input. The second data detector circuit is operable to apply a second data detection algorithm to the detector input to yield a second detected output.

Other embodiments of the present invention provide methods for data processing that include: applying a data detection algorithm by a data detector circuit to a data set to yield a detected output; filtering the detected output to yield a filtered output; calculating an error value based upon a combination of an instance of the data set and a corresponding instance of the filtered output; and scaling the instance of the data set by a gain feedback value to yield a gain corrected output. The gain feedback value is derived from the error value. In some cases, the methods further include averaging the an error value with previously calculated error values to yield an average output. In such cases, the gain feedback value is the average output. In various cases, the methods further include determining whether the instance of the data set is unreliable, and setting the error value equal to one when the instance of the data set is identified as unreliable. The instance of the data set is identified as unreliable when the instance of the data set is greater than a first threshold or less than a second threshold.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1b shows an error accumulator circuit that may be used in relation to the data processing system of FIG. 1a;

DETAILED DESCRIPTION OF THE INVENTION

The present invention is related to systems and methods for data processing, and more particularly to systems and methods for post processing error correction.

Various embodiments of the present invention include a post processing gain control circuit within a data processing system. The post processing gain control circuit is implemented at least in part in the digital domain to mitigate gain distortion in a received analog signal. In some cases, the post processing gain control circuit operates on a series of digital samples from an analog to digital converter circuit to provide a gain corrected output to a downstream data processing circuit.

Figure 1A:
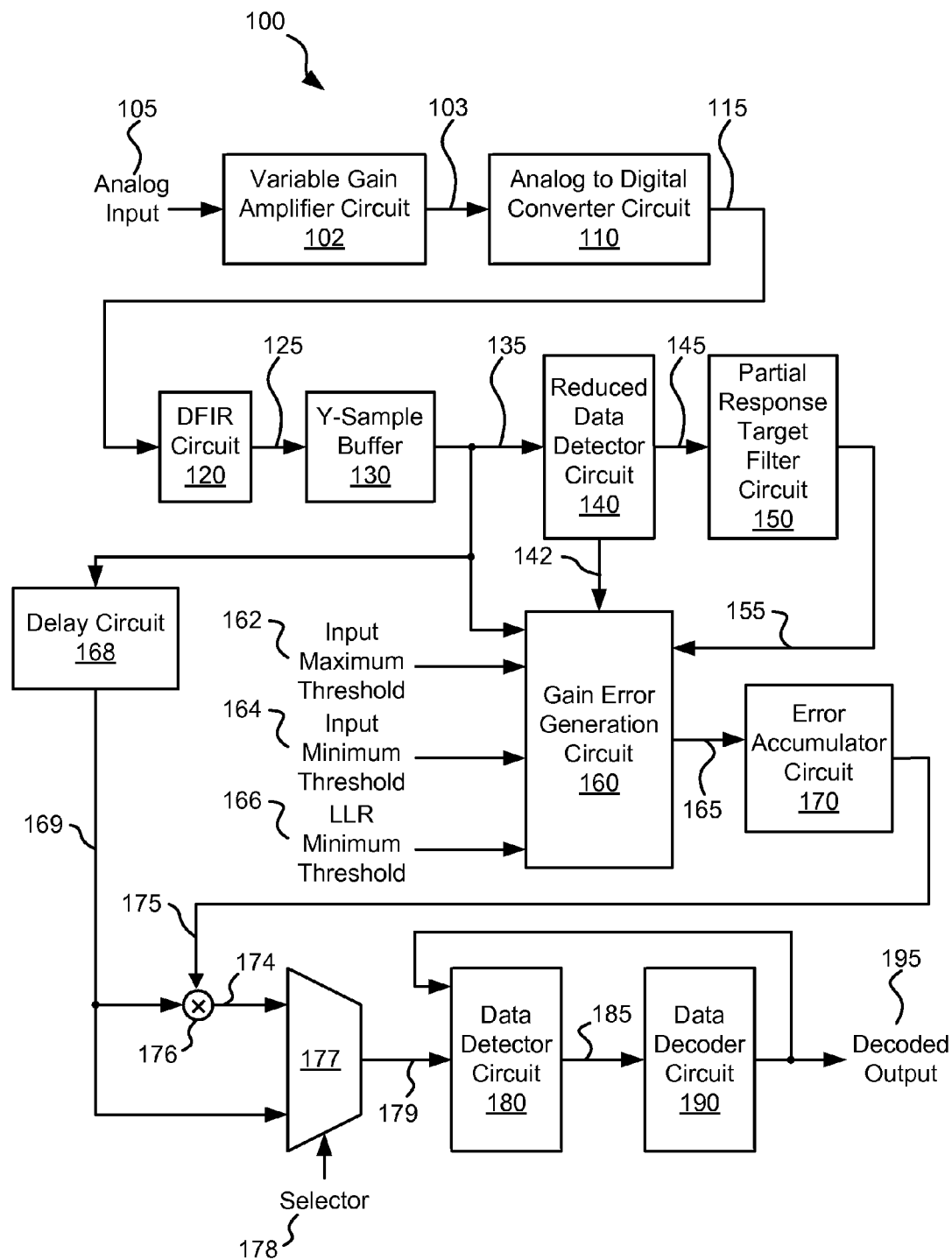
FIG. 1a depicts a data processing system including post processing gain correction in accordance with one or more embodiments of the present invention.

Turning to FIG. 1a, a data processing system 100 including post processing gain correction is shown in accordance with one or more embodiments of the present invention. Data processing system 100 includes a variable gain amplifier circuit 102 that is operable to apply a variable gain to an analog input to yield an amplified output 103. Variable gain amplifier circuit 102 may be any circuit known in the art that is capable of applying a variable gain to a received input. Based upon the disclosure provided herein, one of ordinary skill in the art will recognize a variety of variable gain amplifier circuits that may be used in relation to different embodiments of the present invention. Amplified output 103 is provided to an analog to digital converter circuit 110 where it is converted into a series of digital samples 115. The series of digital samples 115 are provided to an equalizer circuit 120. In some embodiments of the present invention, equalizer circuit 120 is a digital finite impulse response (DFIR) filter as are known in the art. Equalizer circuit 120 filters the received input and provides a corresponding filtered output 125 (i.e., Y-Sample Output), and filtered output 125 is stored to a Y-Sample buffer 130.

A buffer output 135 from Y-sample buffer 130 is provided to a delay circuit 168, a gain error generation circuit 160, and a reduced data detector circuit 140. Reduced data detector circuit 140 may be a simplified data detector circuit. For example, reduced data detector circuit 140 may be a slicer circuit that indicates one logic level when a received value of buffer output 135 is greater than a threshold, and another logic level when the received value of buffer output 135 is less than or equal to the threshold. In other cases, reduced data detector circuit 140 may be a Viterbi algorithm data detector circuit. In such cases, where a data detector circuit 180 is a Viterbi algorithm data detector circuit, reduced data detector circuit 140 may be a less complex version of a Viterbi algorithm data detector circuit when compared to data detector circuit 180. Alternatively, reduced data detector circuit 140 may be a maximum a posteriori data detector circuit. In such cases, where a data detector circuit 180 is a maximum a posteriori data detector circuit, reduced data detector circuit 140 may be a less complex version of a maximum a posteriori data detector circuit when compared to data detector circuit 180.

Reduced data detector circuit 140 applies a reduced data detection algorithm to buffered output 135 to yield a reduced detected output 145 (i.e., hard decisions) to a partial response target filter circuit 150. Partial response target filter circuit 150 filters reduced detected output 145 to yield an ideal output 155 (i.e., Y-Ideal). In addition, reduced data detector circuit 140 provides a soft output 142 (e.g., log-likelihood ratio (LLR) data) to gain error generation circuit 160.

Gain error generation circuit 160 is operable to calculate a symbol by symbol gain error depending upon the various inputs. The calculated gain error is provided as an error output 165 to an error accumulator circuit 170. More particularly, it is determined whether the current symbol of buffered output 135 is sufficiently reliable. Where it is found that the symbol of buffered output 135 is sufficiently reliable, the gain error is calculated in accordance with the following equation:

$$\text{error}[i] = \frac{\text{ideal\_output\_155}[i]}{\text{buffered\_output\_135}[i]},$$

where i indicates the particular symbol. In contrast, where it is found that the symbol of buffered output 135 is not sufficiently reliable, the error value for the current symbol is set equal to one. The calculated error value is provided as error output 165.

The reliability of the current symbol of buffered output 135 may be determined by comparison to one or more of an input maximum threshold 162, an input minimum threshold 164, and an LLR minimum threshold 166. In some embodiments of the present invention, the determination may be made in accordance with the following pseudocode:

```
If(buffered output 135 [i] < input maximum threshold 162 &&
    buffered output 135 [i] > input minimum threshold 164 &&
    soft output 142 [i] > LLR minimum threshold 166)
{
        Reliability = YES
}
Else
{
        Reliability = NO
}
```

Alternatively, in other some embodiments of the present invention, the determination may be made in accordance with the following pseudocode:

```
If(buffered output 135 [i] < input maximum threshold 162 &&
    buffered output 135 [i] > input minimum threshold 164)
{
        Reliability = YES
}
Else
{
        Reliability = NO
}
```

Based upon the disclosure provided herein, one of ordinary skill in the art will recognize a variety of values for input maximum threshold 162, input minimum threshold 164, and LLR minimum threshold 166, and/or combinations thereof that may be used in relation to determining reliability. In some embodiments of the present invention, one or more of input maximum threshold 162, input minimum threshold 164, and LLR minimum threshold 166 may be user programmable.

Error accumulator circuit 170 averages a number of instances of error output 165 to yield a gain error feedback value 175. Delay circuit 168 is operable to delay buffer output 135 to yield a delayed output 169 that is aligned with gain error feedback value 175 generated from a corresponding buffer output 135. Delayed output 169 is provided as one input to a multiplexer circuit 177, and to a multiplier circuit 176. Multiplier circuit 176 multiplies delayed output 169 by gain error feedback value 175 to yield a gain corrected output 174. A selector input 178 is provided to multiplexer circuit 176 to whether gain corrected output 174 or delayed output 169 is provided as a detector input 179.

Detector input 179 is provided to a data detector circuit 180. Data detector circuit 180 performs a data detection process on detector input 179 resulting in a detected output 185. In performing the detection process, data detector circuit 180 attempts to correct any errors in the received data input. In some embodiments of the present invention, data detector circuit is a maximum a posteriori data detector circuit as is known in the art. In other embodiments of the present invention, data detector circuit 180 is a Viterbi algorithm data detector circuit as are known in the art.

Detected output 185 is provided to a data decoder circuit 190. Data decoder circuit may be, but is not limited to, a low density parity check decoder (LDPC) circuit as are known in the art. Data decoder circuit 190 applies a data decode algorithm to detected output 185 to yield a decoded data set. Where the decoded data set fails to converge (i.e., fails to yield the originally written data set), another iteration through one or both of data detector circuit 180 and data decoder circuit 190 may be applied. Otherwise, the decoded data set is provided as a decoded output 195.

Figure 1B:
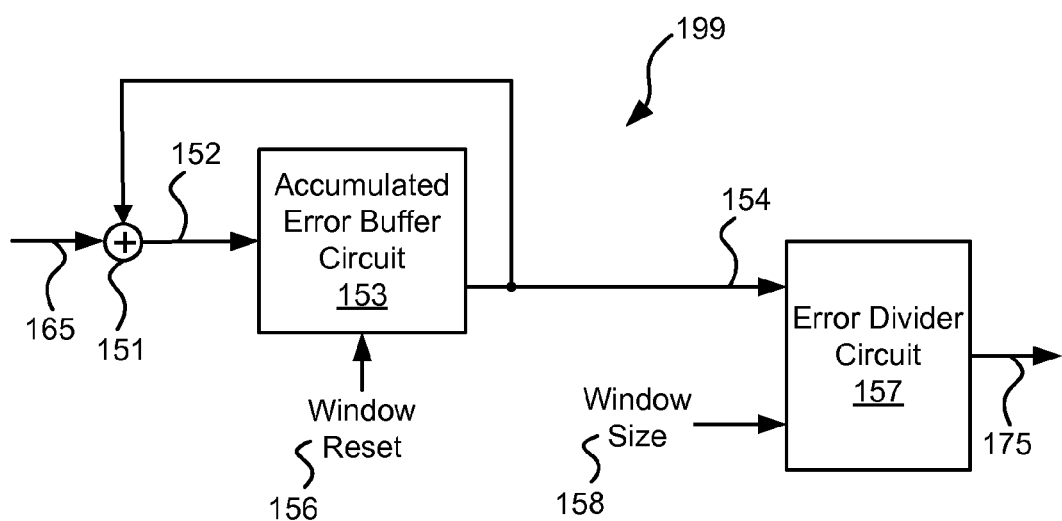

Turning to FIG. 1b, an error accumulator circuit 199 is shown that may be used in that may be used in relation to the data processing system of FIG. 1a. In particular, error accumulator circuit 199 may be used in place of error accumulator circuit 170. Error accumulator circuit 199 includes an adder circuit 151 that adds an accumulated value 154 to error output 165 to yield an updated value 152. Updated value 152 is stored to an accumulated error buffer circuit 153 that provides the stored value as accumulated value 154. The value maintained in accumulated error buffer circuit 153 is reset when a window reset 156 is asserted. Window reset 156 is asserted at the end of a defined window size 158 (i.e., number of symbols). Window size 158 may be, but is not limited to, 32, 64, 128, 256, or 512. Based upon the disclosure provided herein, one of ordinary skill in the art will recognize a variety of values that may be used as window size 158. When window reset 156 is asserted, an error divider circuit 157 divides accumulated value 154 by window size 158 to yield gain error feedback value 175.

Figure 2A:
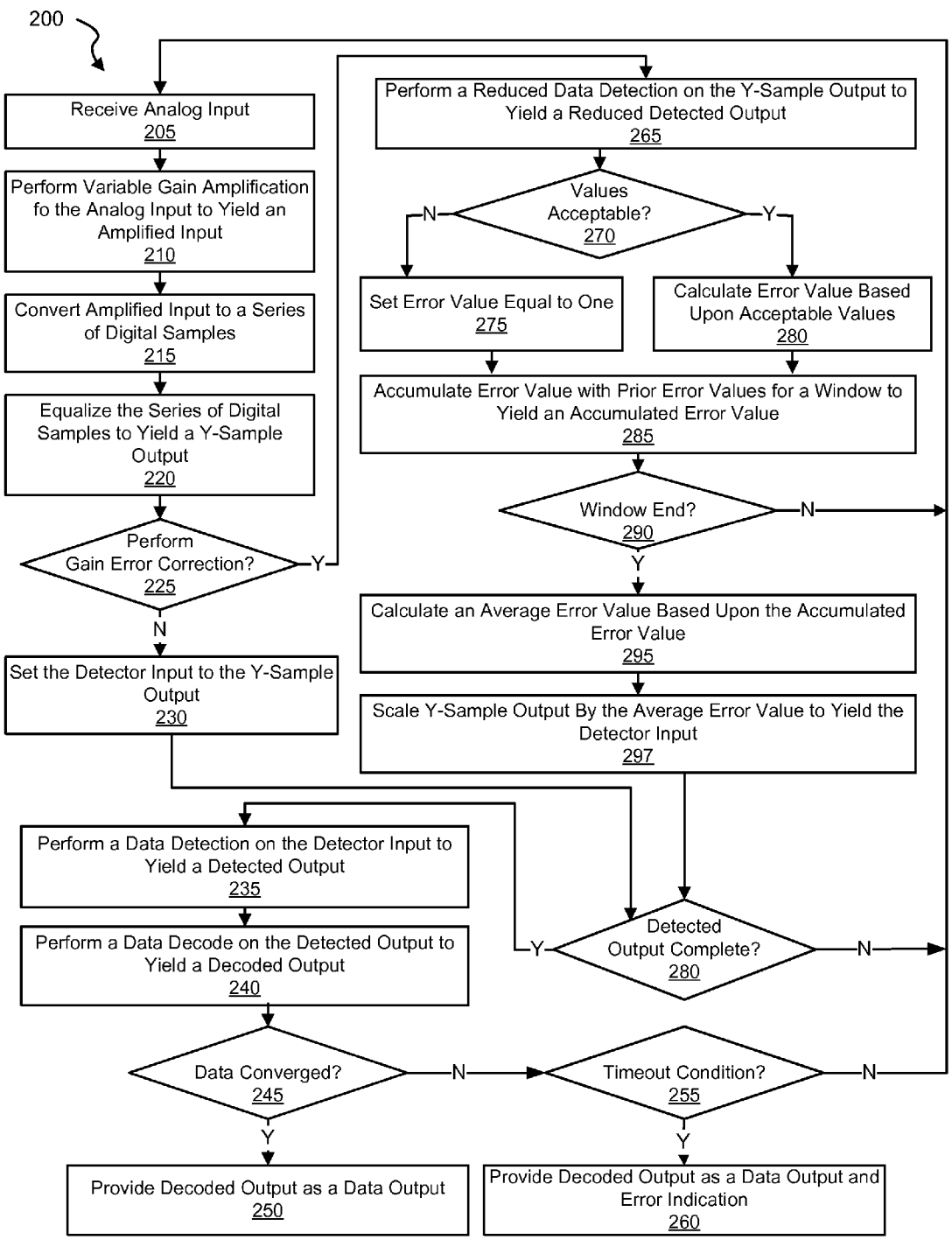
FIGS. 2b-2d is a flow diagram showing a method for data processing including post processing gain correction in accordance with various embodiments of the present invention.

Turning to FIG. 2a, a flow diagram 200 shows a method for data processing including post processing gain correction in accordance with various embodiments of the present invention. Following flow diagram 200, an analog input signal is received (block 205). The analog input may be derived from, for example, a storage medium or a data transmission channel. Based upon the disclosure provided herein, one of ordinary skill in the art will recognize a variety of sources of the analog input. A variable gain amplification is applied to the analog input to yield an amplified output (block 210). This amplification may be done by any circuit known in the art for variable gain amplification. The amplified output is converted to a series of digital samples (block 215). This conversion may be done using an analog to digital converter circuit or system as are known in the art. Of note, any circuit known in the art that is capable of converting an analog signal into a series of digital values representing the received analog signal may be used. The resulting digital samples are equalized to yield a Y-Sample output (block 220). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a gain error correction is to be performed (block 225). Where a gain error correction is not to be performed (block 225), a detector input is set equal to the Y-Sample output (block 230). It is then determined whether the detected output is complete (i.e., whether an entire codeword is ready for decoding)(block 280). Where the detected output is not complete, the process completes. Otherwise, where the detected output is complete (block 280), a data detection is performed on the detector input to yield a detected output (block 235). In some embodiments of the present invention, the data detection is a Viterbi algorithm data detection. In other embodiments of the present invention, the data detection is a maximum a posteriori algorithm data detection. Based upon the disclosure provided herein, one of ordinary skill in the art will recognize a variety of data detection algorithms that may be used in relation to different embodiments of the present invention.

A data decoder circuit performs a data decode on the detected output to yield a decoded output (block 240). The data decoder circuit may be, but is not limited to, an LDPC circuit as are known in the art. It is determined whether the data converged (i.e., yielded the original data set) (block 245). Where the data converged (block 245), the decoded output is provided as a data output (block 250). Alternatively, where the data failed to converge (block 245), it is determined whether a timeout condition has occurred (block 255). Where the timeout condition occurred (block 255), the decoded output is provided as a data output along with an error indication (block 260).

Alternatively, where a gain error correction is to be performed (block 225), a reduced data detection is performed on the Y-Sample output to yield a reduced detected output (block 265). The reduced data detection may be, but is not limited to, a Viterbi algorithm data detection or a maximum a posteriori data detection. Where the data detection of block 235 is a Viterbi algorithm data detector circuit, the reduced data detection may be a less complex version of a Viterbi algorithm data detector circuit when compared to that of block 235. In other cases where the data detection of block 235 is a maximum a posteriori data detection, the reduced data detection may be a less complex version of the maximum a posteriori data detection when compared to the data detection of block 235.

It is then determined whether the received values are acceptable (block 270). Where the values are acceptable (block 270), a error value is calculated based upon the acceptable values (block 280). Otherwise, the error value is set equal to one (block 275). The error value is then accumulated with prior error values over a window of time to yield an accumulated error value (block 285). It is determined whether the end of the window has occurred (a predetermined number of samples have been processed) (block 290). The window size may be, but is not limited to, 32, 64, 128, 256, or 512. Based upon the disclosure provided herein, one of ordinary skill in the art will recognize a variety of values that may be used as the window size. Where the window has not yet been achieved (block 290), the process completes. Otherwise, where the window has been achieved (block 290), an average error value is calculated based upon the accumulated error value (block 295). This average error value may be calculated by dividing the accumulated error value by the window size.

The Y-Sample output (block 230) is scaled by the average error value to yield the detector input (block 297). This may be done by multiplying the Y-sample output by the average error value. The process then completes using the previously described blocks 280, 235, 240, 245, 250, 255, 260.

Turning to FIG. 2b, a flow diagram 202 depicts the process of block 280 of FIG. 2a is shown in more detail. Following flow diagram 202, a partial response target filtering is applied to the reduced detected output to yield a Y-ideal value (block 222). Corresponding instances of the Y-ideal value and the Y-sample value are used to calculate an error value (block 224). In particular, the error value is calculated in accordance with the following equation:

$$\text{error value}[i] = \frac{Y - \text{ideal value}[i]}{Y - \text{sample value}[i]},$$

where i indicates the particular symbol. The process is then returned to block 285 of FIG. 2a.

Turning to FIG. 2c, a flow diagram 204 depicts one embodiment of the process of block 270 FIG. 2a is shown in more detail. Following flow diagram 204, it is determined whether the LLR value (i.e., the soft data from the reduced data detection) is greater than an LLR minimum (block 232). In some cases, the LLR minimum may be a user programmable value. Where the LLR value is greater than the LLR minimum (block 232), it is determined whether the Y-Sample output is greater than a sample minimum (block 234). In some cases, the sample minimum may be a user programmable value. Where it is determined that the Y-Sample output is greater than the sample minimum (block 234), it is determined whether the Y-Sample output is less than a sample maximum (block 236). In some cases, the sample maximum may be a user programmable value. Where it is determined that the Y-Sample output is less than the sample maximum (block 236), the received values are acceptable and a yes is returned causing processing to continue at block 280 (block 238). Where either the LLR value is less than the LLR minimum (block 232), the Y-Sample output is less than the sample minimum (block 234), or the Y-Sample output is greater than the sample maximum (block 236), the received values are not acceptable and a no is returned causing processing to continue at block 275 (block 238).

Turning to FIG. 2d, a flow diagram 206 depicts one embodiment of the process of block 270 FIG. 2a is shown in more detail. Following flow diagram 206, it is determined whether the Y-Sample output is greater than a sample minimum (block 254). In some cases, the sample minimum may be a user programmable value. Where it is determined that the Y-Sample output is greater than a sample minimum (block 254), it is determined whether the Y-Sample output is less than a sample maximum (block 256). In some cases, the sample maximum may be a user programmable value. Where it is determined that the Y-Sample output is less than the sample maximum (block 256), the received values are acceptable and a yes is returned causing processing to continue at block 280 (block 252). Where either the Y-Sample output is less than the sample minimum (block 254), or the Y-Sample output is greater than the sample maximum (block 256), the received values are not acceptable and a no is returned causing processing to continue at block 275 (block 258).

Figure 3:
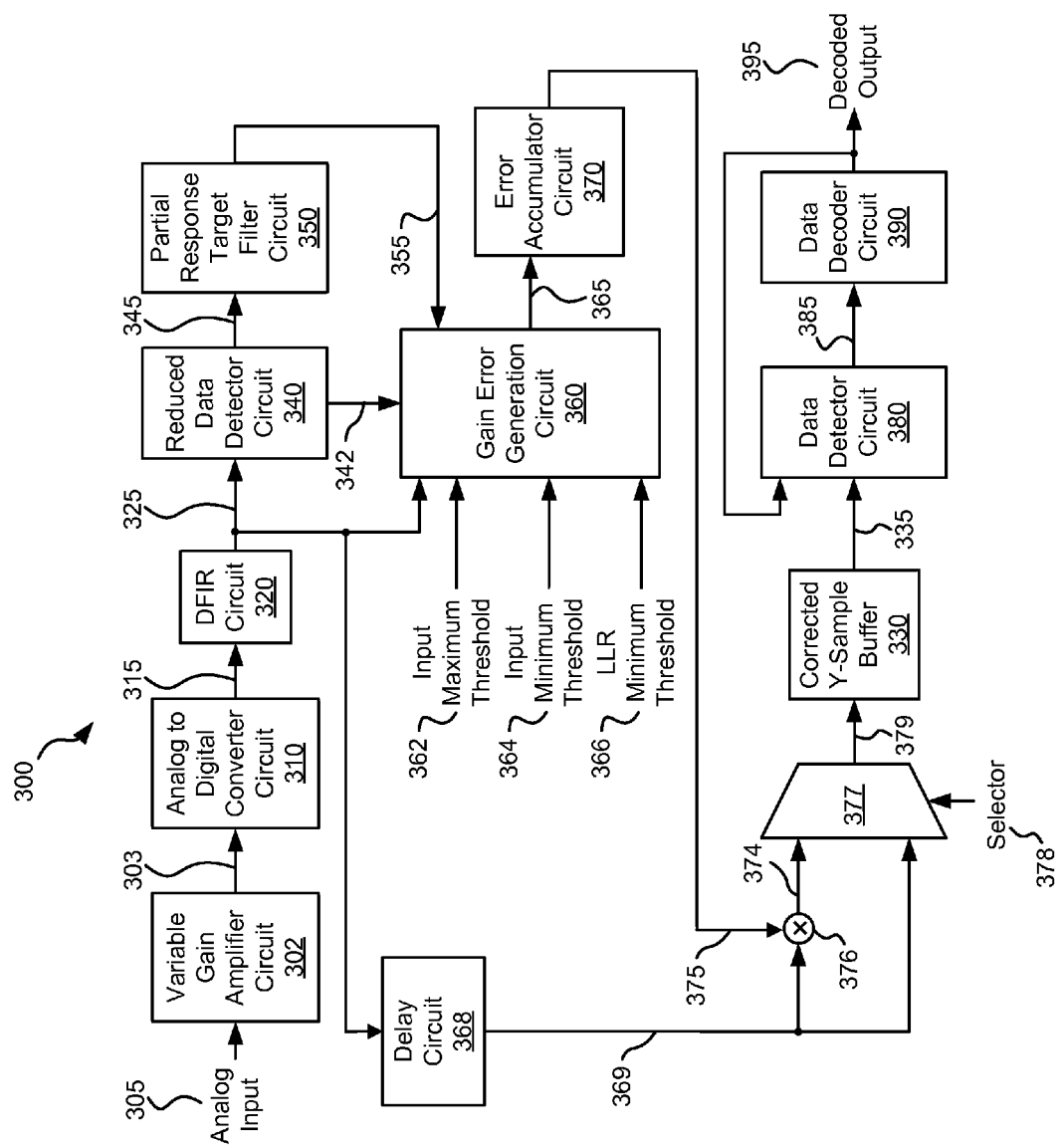
FIG. 3 depicts another data processing system including post processing gain correction in accordance with other embodiments of the present invention.

Turning to FIG. 3, another data processing system 300 including post processing gain correction is shown in accordance with other embodiments of the present invention. Data processing system 300 includes a variable gain amplifier circuit 302 that is operable to apply a variable gain to an analog input to yield an amplified output 303. Variable gain amplifier circuit 302 may be any circuit known in the art that is capable of applying a variable gain to a received input. Based upon the disclosure provided herein, one of ordinary skill in the art will recognize a variety of variable gain amplifier circuits that may be used in relation to different embodiments of the present invention. Amplified output 303 is provided to an analog to digital converter circuit 310 where it is converted into a series of digital samples 315. The series of digital samples 315 are provided to an equalizer circuit 320. In some embodiments of the present invention, equalizer circuit 320 is a digital finite impulse response (DFIR) filter as are known in the art. Equalizer circuit 320 filters the received input and provides a corresponding filtered output 325 (i.e., Y-S ample Output).

Filtered output 325 is provided to a delay circuit 368, a gain error generation circuit 360, and a reduced data detector circuit 340. Reduced data detector circuit 340 may be a simplified data detector circuit. For example, reduced data detector circuit 340 may be a slicer circuit that indicates one logic level when a received value of filtered output 325 is greater than a threshold, and another logic level when the received value of filtered output 325 is less than or equal to the threshold. In other cases, reduced data detector circuit 340 may be a Viterbi algorithm data detector circuit. In such cases, where a data detector circuit 380 is a Viterbi algorithm data detector circuit, reduced data detector circuit 340 may be a less complex version of a Viterbi algorithm data detector circuit when compared to data detector circuit 380. Alternatively, reduced data detector circuit 340 may be a maximum a posteriori data detector circuit. In such cases, where a data detector circuit 380 is a maximum a posteriori data detector circuit, reduced data detector circuit 340 may be a less complex version of a maximum a posteriori data detector circuit when compared to data detector circuit 380.

Reduced data detector circuit 340 applies a reduced data detection algorithm to filtered output 325 to yield a reduced detected output 345 (i.e., hard decisions) to a partial response target filter circuit 350. Partial response target filter circuit 350 filters reduced detected output 345 to yield an ideal output 355 (i.e., Y-Ideal). In addition, reduced data detector circuit 340 provides a soft output 342 (e.g., log-likelihood ratio (LLR) data) to gain error generation circuit 360.

Gain error generation circuit 360 is operable to calculate a symbol by symbol gain error depending upon the various inputs. The calculated gain error is provided as an error output 365 to an error accumulator circuit 370. More particularly, it is determined whether the current symbol of buffered output 335 is sufficiently reliable. Where it is found that the symbol of buffered output 335 is sufficiently reliable, the gain error is calculated in accordance with the following equation:

$$\text{error}[i] = \frac{\text{ideal output } 355[i]}{\text{filtered output } 325[i]},$$

where i indicates the particular symbol. In contrast, where it is found that the symbol of filtered output 325 is not sufficiently reliable, the error value for the current symbol is set equal to one. The calculated error value is provided as error output 365.

The reliability of the current symbol of filtered output 325 may be determined by comparison to one or more of an input maximum threshold 362, an input minimum threshold 364, and an LLR minimum threshold 366. In some embodiments of the present invention, the determination may be made in accordance with the following pseudocode:

```
If(filtered output 325 [i] < input maximum threshold 362 &&
    filtered output 325 [i] > input minimum threshold 364 &&
    soft output 342 [i] > LLR minimum threshold 366)
{
        Reliability = YES
}
Else
{
        Reliability = NO
}
```

Alternatively, in other some embodiments of the present invention, the determination may be made in accordance with the following pseudocode:

```
If(filtered output 325 [i] < input maximum threshold 362 &&
    filtered output 325 [i] > input minimum threshold 364)
{
        Reliability = YES
}
Else
{
        Reliability = NO
}
```

Based upon the disclosure provided herein, one of ordinary skill in the art will recognize a variety of values for input maximum threshold 362, input minimum threshold 364, and LLR minimum threshold 366, and/or combinations thereof that may be used in relation to determining reliability. In some embodiments of the present invention, one or more of input maximum threshold 362, input minimum threshold 364, and LLR minimum threshold 366 may be user programmable.

Error accumulator circuit 370 averages a number of instances of error output 365 to yield a gain error feedback value 375. Delay circuit 368 is operable to delay buffer output 335 to yield a delayed output 369 that is aligned with gain error feedback value 375 generated from a corresponding buffer output 335. Delayed output 369 is provided as one input to a multiplexer circuit 377, and to a multiplier circuit 376. Multiplier circuit 376 multiplies delayed output 369 by gain error feedback value 375 to yield a gain corrected output 374. A selector input 378 is provided to multiplexer circuit 376 to whether gain corrected output 374 or delayed output 369 is provided as a detector input 379.

Detector input 379 is provided to a corrected Y-Sample buffer 330 that provides the stored data as a buffered output 335. Buffered output 335 is provided to a data detector circuit 380. Data detector circuit 380 performs a data detection process on detector input 379 resulting in a detected output 385. In performing the detection process, data detector circuit 380 attempts to correct any errors in the received data input. In some embodiments of the present invention, data detector circuit is a maximum a posteriori data detector circuit as is known in the art. In other embodiments of the present invention, data detector circuit 380 is a Viterbi algorithm data detector circuit as are known in the art.

Detected output 385 is provided to a data decoder circuit 390. Data decoder circuit may be, but is not limited to, a low density parity check decoder (LDPC) circuit as are known in the art. Data decoder circuit 390 applies a data decode algorithm to detected output 385 to yield a decoded data set. Where the decoded data set fails to converge (i.e., fails to yield the originally written data set), another iteration through one or both of data detector circuit 380 and data decoder circuit 390 may be applied. Otherwise, the decoded data set is provided as a decoded output 395.

Figure 4:
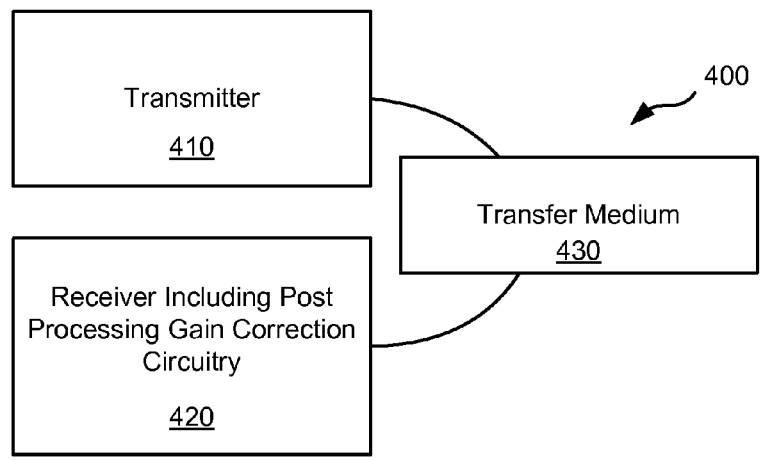
FIG. 4 depicts a communication system including a receiver with post processing gain correction circuitry in accordance with some embodiments of the present invention.

Turning to FIG. 4, a communication system 400 including a receiver with post processing gain correction circuitry in accordance with some embodiments of the present invention. Communication system 400 includes a transmitter 410 that is operable to transmit encoded information via a transfer medium 430 as is known in the art. The encoded data is received from transfer medium 430 by receiver 420. Receiver 420 incorporates post processing gain correction circuitry that may be implemented similar to that discussed above in relation to FIGS. 1a-1b or FIG. 3, and/or operate similar to that described above in relation to FIG. 2.

Figure 5:
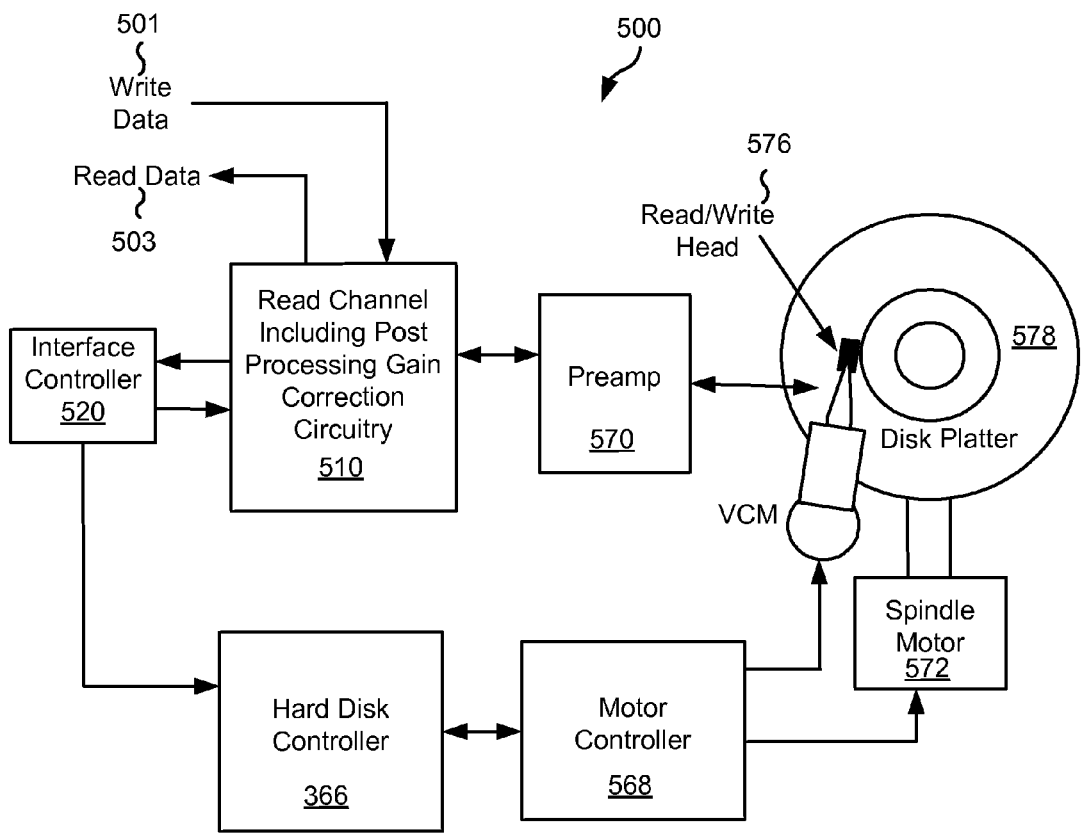
FIG. 5 shows a storage system including a read channel circuit with post processing gain correction circuitry in accordance with some embodiments of the present invention.

FIG. 5 shows a storage system 500 including a read channel circuit 510 with post processing gain correction circuitry in accordance with some embodiments of the present invention. Storage system 500 may be, for example, a hard disk drive. Storage system 500 also includes a preamplifier 570, an interface controller 520, a hard disk controller 566, a motor controller 568, a spindle motor 572, a disk platter 578, and a read/write head assembly 576. Interface controller 520 controls addressing and timing of data to/from disk platter 578. The data on disk platter 578 consists of groups of magnetic signals that may be detected by read/write head assembly 576 when the assembly is properly positioned over disk platter 578. In one embodiment, disk platter 578 includes magnetic signals recorded in accordance with either a longitudinal or a perpendicular recording scheme.

In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs). Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel circuit 510 via preamplifier 570. Preamplifier 570 is operable to amplify the minute analog signals accessed from disk platter 578. In turn, read channel circuit 510 decodes and digitizes the received analog signal to recreate the information originally written to disk platter 578. This data is provided as read data 503 to a receiving circuit. As part of decoding the received information, read channel circuit 510 processes the received signal using the with post processing gain correction circuitry that may be implemented similar to that described above in relation to FIGS. 1a-1b or FIG. 3, and/or operate similar to that described above in relation to FIG. 2. A write operation is substantially the opposite of the preceding read operation with write data 501 being provided to read channel circuit 510. This data is then encoded and written to disk platter 578.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data detector circuit operable to apply a data detection algorithm to a data set to yield a detected output;
    a filter circuit operable to filter the detected output to yield a filtered output;
    a gain error generation circuit operable to calculate an error value based upon a combination of an instance of the data set and a corresponding instance of the filtered output; and
    a multiplier circuit operable to multiply the instance of the data set by a gain feedback value to yield a gain corrected output, wherein the gain feedback value is derived from the error value.

2. The data processing system of claim 1, wherein the data processing system further comprises:
    an error accumulator circuit operable to average the error value with previously calculated error values to yield an average output, wherein the gain feedback value is the average output.

3. The data processing system of claim 1, wherein the gain error circuit is further operable to filter the instance of the data set to yield a reliability indication.

4. The data processing system of claim 3, wherein filtering the instance of the data set to yield the reliability indication includes comparing the instance of the data set with a first threshold and as second threshold, and wherein the reliability indication identifies the instance of the data set as reliable when the instance of the data set is greater than the first threshold and less than the second threshold.

5. The data processing system of claim 3, wherein filtering the instance of the data set to yield the reliability indication includes:
    comparing the instance of the data set with a first threshold and as second threshold;
    comparing a soft data output from the data detector circuit corresponding to the instance of the data set against a third threshold value; and
    wherein the reliability indication identifies the instance of the data set as reliable when the instance of the data set is greater than the first threshold and less than the second threshold, and the soft data output is greater than the third threshold.

6. The data processing system of claim 3, wherein the error value is set equal to one when the reliability indication identifies the instance of the data set as unreliable.

7. The data processing system of claim 1, wherein the data detector circuit is a first data detector circuit, wherein the data detection algorithm is a first data detection algorithm, wherein the detected output is a first detected output, and wherein the data processing system further comprises:
    a second data detector circuit operable to apply a second data detection algorithm to the gain corrected output to yield a second detected output.

8. The data processing system of claim 7, wherein the first data detector circuit is a first Viterbi algorithm data detector circuit and the second data detector circuit is a second Viterbi algorithm data detector circuit, and wherein the first Viterbi algorithm data detector circuit includes less circuitry than the second Viterbi algorithm data detector circuit.

9. The data processing system of claim 1, wherein the data detector circuit is a first data detector circuit, wherein the data detection algorithm is a first data detection algorithm, wherein the detected output is a first detected output, and wherein the data processing system further comprises:
    a multiplexer circuit operable to provide one of the gain corrected output and the data set as a detector input; and
    a second data detector circuit operable to apply a second data detection algorithm to the detector input to yield a second detected output.

10. The data processing system of claim 9, wherein the data processing system further comprises:
    a buffer circuit operable to store the detector input.

11. The data processing system of claim 9, wherein the data processing system further comprises:
a delay circuit operable to align instances of the gain corrected output with corresponding instances of the data set.

12. The data processing system of claim 1, wherein the data processing system is implemented as part of a device selected from a group consisting of: a storage device and a receiving device.

13. The data processing system of claim 1, wherein the data processing system is implemented as part of an integrated circuit.

14. The data processing system of claim 1, wherein the data processing system further comprises:
a variable gain amplifier operable to amplify an analog input by a variable gain to yield an amplified output;
an analog to digital converter circuit operable to convert the amplified output to yield a series of digital samples; and
an equalizer circuit operable to equalize the series of digital samples to yield the data set.

15. The data processing system of claim 1, wherein the data processing system further comprises:
a buffer circuit operable to store the data set.

16. A method for data processing, the method comprising:
applying a data detection algorithm by a data detector circuit to a data set to yield a detected output;
filtering the detected output to yield a filtered output;
calculating an error value based upon a combination of an instance of the data set and a corresponding instance of the filtered output; and
scaling the instance of the data set by a gain feedback value to yield a gain corrected output, wherein the gain feedback value is derived from the error value.

17. The method of claim 16, wherein the method further comprises:
averaging the an error value with previously calculated error values to yield an average output, wherein the gain feedback value is the average output.

18. The method of claim 16, wherein the method further comprises:
determining whether the instance of the data set is unreliable, wherein the instance of the data set is identified as unreliable when the instance of the data set is greater than a first threshold or less than a second threshold; and
setting the error value equal to one when the instance of the data set is identified as unreliable.

19. A storage device, the storage device comprising:
a storage medium;
a head assembly disposed in relation to the storage medium and operable to provide a sensed signal corresponding to information on the storage medium;
a read channel circuit including:
a variable gain amplifier circuit operable to amplify an analog signal derived from the sensed signal to yield an amplified output;
an analog to digital converter circuit operable to sample the amplified output to yield a series of digital samples;
an equalizer circuit operable to equalize the digital samples to yield a data set;
a data detector circuit operable to apply a data detection algorithm to a data set to yield a detected output;
a filter circuit operable to filter the detected output to yield a filtered output;
a gain error generation circuit operable to calculate an error value based upon a combination of an instance of the data set and a corresponding instance of the filtered output; and
a multiplier circuit operable to multiply the instance of the data set by a gain feedback value to yield a gain corrected output, wherein the gain feedback value is derived from the error value.

20. The storage device of claim 19, wherein the data detector circuit is a first data detector circuit, wherein the data detection algorithm is a first data detection algorithm, wherein the detected output is a first detected output, and wherein the data processing system further comprises:
a second data detector circuit operable to apply a second data detection algorithm to the gain corrected output to yield a second detected output.

21. The storage device of claim 19, wherein the data detector circuit is a first data detector circuit, wherein the data detection algorithm is a first data detection algorithm, wherein the detected output is a first detected output, and wherein the data processing system further comprises:
a multiplexer circuit operable to provide one of the gain corrected output and the data set as a detector input; and
a second data detector circuit operable to apply a second data detection algorithm to the detector input to yield a second detected output.

* * * * *